(12) United States Patent
Kim

(10) Patent No.: US 9,674,624 B2
(45) Date of Patent: Jun. 6, 2017

(54) SYSTEM AND METHOD FOR RESETTING AMPLIFIER OF AVN SYSTEM FOR VEHICLE

(71) Applicant: Hyundai Motor Company, Seoul (KR)

(72) Inventor: Jong Hyup Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 131 days.

(21) Appl. No.: 14/286,006

(22) Filed: May 23, 2014

(65) Prior Publication Data

US 2015/0163611 A1    Jun. 11, 2015

(30) Foreign Application Priority Data

Dec. 5, 2013  (KR) .......................... 10-2013-0150418

(51) Int. Cl.
*H04R 29/00*     (2006.01)
*H03G 3/30*      (2006.01)
*H03G 3/34*      (2006.01)

(52) U.S. Cl.
CPC ........... *H04R 29/00* (2013.01); *H03G 3/3026* (2013.01); *H03G 3/342* (2013.01); *H04R 2499/13* (2013.01)

(58) Field of Classification Search
CPC .. H04R 29/00; H04R 2499/13; H03G 3/3026; H03G 3/342
See application file for complete search history.

(56) References Cited

U.S. PATENT DOCUMENTS

| | | | |
|---|---|---|---|
| 7,636,446 B1* | 12/2009 | Orvis | H03F 1/52 330/207 A |
| 9,041,461 B2* | 5/2015 | Chang | H03F 1/305 330/10 |
| 9,146,122 B2* | 9/2015 | Ellanti | G01C 21/3608 |
| 2010/0074455 A1* | 3/2010 | Frauenthal | H04M 9/082 381/94.1 |

FOREIGN PATENT DOCUMENTS

| | | |
|---|---|---|
| EP | 1069750 A2 | 1/2001 |
| JP | 2005-242375 A | 9/2005 |
| JP | 2012-004981 A | 1/2012 |
| KR | 10-2003-0091545 A | 12/2003 |
| KR | 10-2007-0011991 | 1/2007 |
| KR | 10-1081826 B1 | 11/2011 |
| KR | 10-2012-0063338 | 6/2012 |
| KR | 10-1172238 B1 | 8/2012 |

* cited by examiner

*Primary Examiner* — Andrew L Sniezek
(74) *Attorney, Agent, or Firm* — Mintz Levin Cohn Ferris Glovsky and Popeo, P.C.; Peter F. Corless

(57) ABSTRACT

A system and method for resetting an amplifier of an AVN system are provided. The system includes a microphone that is configured to sense whether a non-audible frequency is output from the amplifier through the speaker. In addition, a reset controller is configured to receive a signal from the microphone and determine whether to reset the amplifier.

9 Claims, 2 Drawing Sheets

SYSTEM AND METHOD FOR RESETTING AMPLIFIER OF AVN SYSTEM FOR VEHICLE

CROSS-REFERENCE TO RELATED APPLICATION

This application claims under 35 U.S.C. §119(a) the benefit of Korean Patent Application No. 10-2013-0150418 filed Dec. 5, 2013 the entire contents of which are incorporated herein by reference.

BACKGROUND (a) Technical Field

The present invention relates to a system for resetting an amplifier of an AVN (Audio, Video and Navigation) system for a vehicle and a method thereof. More particularly, the present invention relates to a system for resetting an amplifier of an AVN system for a vehicle that automatically resets the amplifier when the AVN system is down (e.g., fails) to prevent sound from being output, and a method thereof.

(b) Background Art

An AVN (Audio, Video and Navigation) system, which is a multi-media system of a single unit into which a head unit, an audio unit, a video unit, a navigation unit and a telematics unit are integrated, allows a user to concentrically operate various multimedia apparatuses to provide user convenience and allows the spaces of the instrument panel and center fascia of a vehicle to be effectively utilized.

The AVN system includes an amplifier that amplifies audio signals of each unit and outputs the amplified signals through a speaker. Although the amplifier is a significant component for amplifying and outputting various audio signals, due to conflict between several logics in the amplifier, amplifier failure may occur and prevents the sound from being output. When the amplifier fails, a reset button has to be manually pushed to rest the amplifier causing the amplifier to restart and be operated again.

A known method in the related art includes a method of resetting an amplifier that includes a first terminal which outputs an error signal having a predetermined voltage or greater when a temporary error signal such as a speaker discharge is generated, and a second terminal which stops outputting sound when a mute signal is input. However, since the amplifier is reset by the amplifier resetting process when the mute signal is input when an error signal is output from the first terminal, the mute signal is required to reset the amplifier. In addition, when the mute signal is not generated, the amplifier may not be reset.

SUMMARY

The present invention provides a system for resetting an amplifier of an AVN system for a vehicle in which the amplifier is automatically reset according to an instruction of a head unit in response to determining that a non-audible frequency, output through a speaker by a non-audible frequency output unit of an amplifier, is not input to a head unit through a microphone in the vehicle interior and the AVN system is not in a mute state, and a method thereof.

A system for resetting an amplifier of an AVN system for a vehicle according to one aspect of the present invention may include a non-audible frequency output unit installed within an amplifier and configured to output a non-audible frequency through a speaker; an in-vehicle microphone configured to sense whether the non-audible frequency is output through the speaker; and a reset controller configured to receive a signal from the microphone and determine whether to reset the amplifier, where the signal results from sensing whether the non-audible frequency may be output.

The system may further include a sound mute unit configured to determine whether to mute sound, wherein the reset controller may be configured to determine whether to reset the amplifier. Specifically, the reset controller may be configured to reset the amplifier when the reset controller does not receive an output signal having the non-audible frequency from the microphone and receives a non-mute signal from a sound mute unit.

A method of resetting an amplifier of an AVN system for a vehicle according to one aspect of the present invention may include outputting a non-audible frequency by a non-audible frequency output unit of an amplifier; sensing an output signal having the non-audible frequency by an in-vehicle microphone; determining whether to reset the amplifier based on whether the output signal having the non-audible frequency is received and whether sound is muted.

Specifically, the reset controller may be configured to operate the reset of the amplifier when the reset controller does not receive the output signal having the non-audible frequency and the amplifier is not in a mute state. In addition, when the reset controller receives the output signal having the non-audible frequency the reset controller may be configured to prevent the resetting of the amplifier and determine that the amplifier is operating normally (e.g., without failure). The reset controller may be configured to not reset the amplifier (e.g., allow the amplifier to operate normally) when a mute function of a sound mute unit of the amplifier is operated. Further, the non-audible frequency output unit of the amplifier may be configured to stop outputting the non-audible frequency when the mute function of the sound mute unit is operated.

Accordingly, the system and method for resetting an amplifier of an AVN (Audio, Video and Navigation) system for a vehicle according to the present invention have the following advantages. In response to determining that a non-audible frequency, output through a speaker by a non-audible frequency output unit of an amplifier, is not input to a head unit through a microphone in the vehicle interior and the AVN system is not in a mute state, the amplifier may be automatically reset, thus improving the user inconvenience of restarting the amplifier and eliminating manual restarting of the amplifier.

BRIEF DESCRIPTION OF THE DRAWINGS

The above and other features of the present invention will now be described in detail with reference to certain exemplary embodiments thereof illustrated the accompanying drawings which are given hereinbelow by way of illustration only, and thus are not limitative of the present invention, and wherein.

Figure 1:
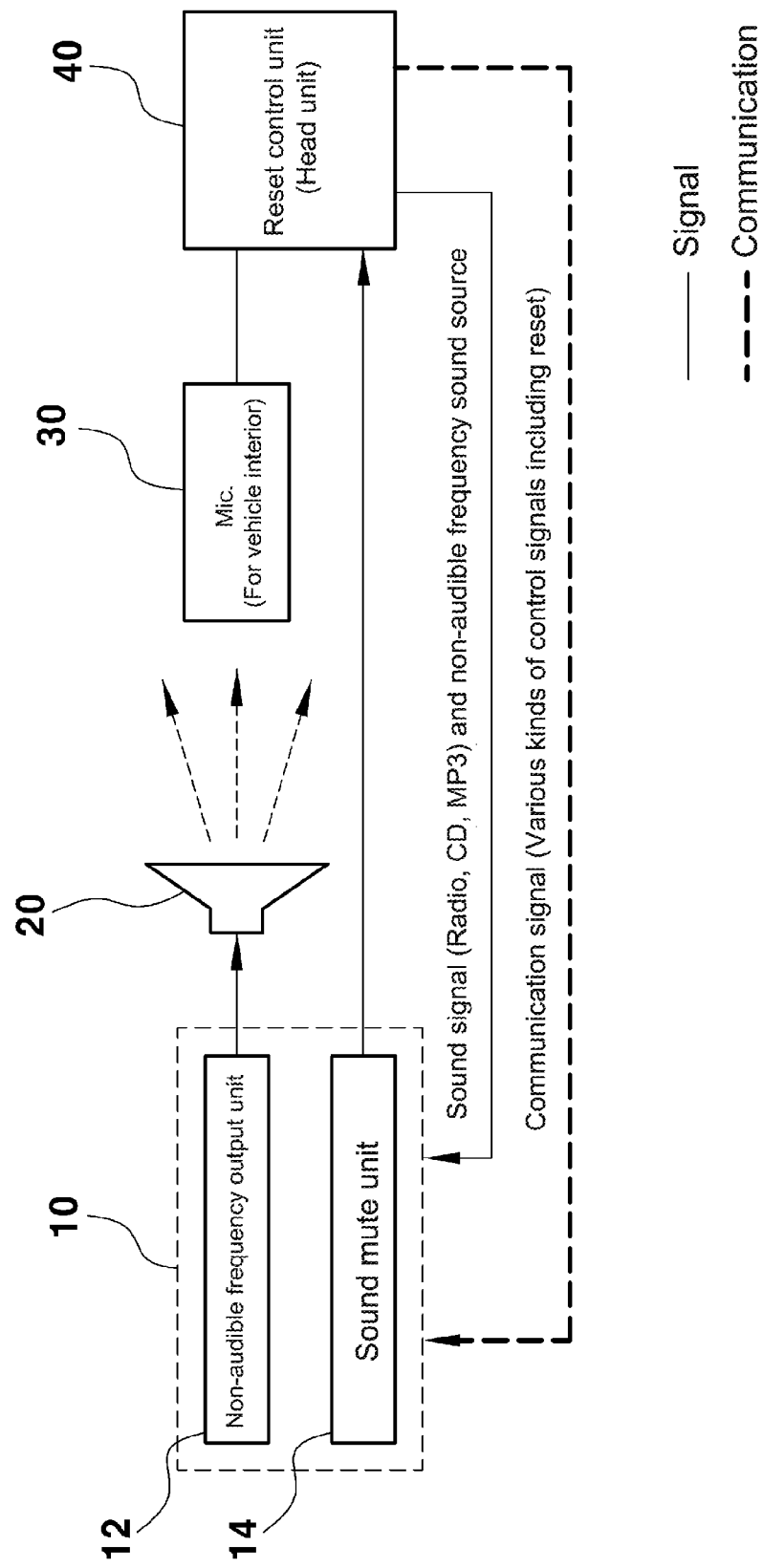
FIG. 1 is an exemplary block diagram showing a system for resetting an amplifier of an AVN system for a vehicle according to an exemplary embodiment of the present invention.

It should be understood that the accompanying drawings are not necessarily to scale, presenting a somewhat simplified representation of various exemplary features illustrative of the basic principles of the invention. The specific design features of the present invention as disclosed herein, including, for example, specific dimensions, orientations, locations, and shapes will be determined in part by the particular intended application and use environment. In the figures, reference numbers refer to the same or equivalent parts of the present invention throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g., fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, an exemplary embodiment of the present invention will be described in detail with reference to accompanying drawings. Referring to FIG. 1, the AVN system may include an amplifier configured to amplify an audio signal (radio, CD or MP3) from an audio unit, a video unit and a navigation unit and output the amplified audio signal through a speaker.

Figure 2:
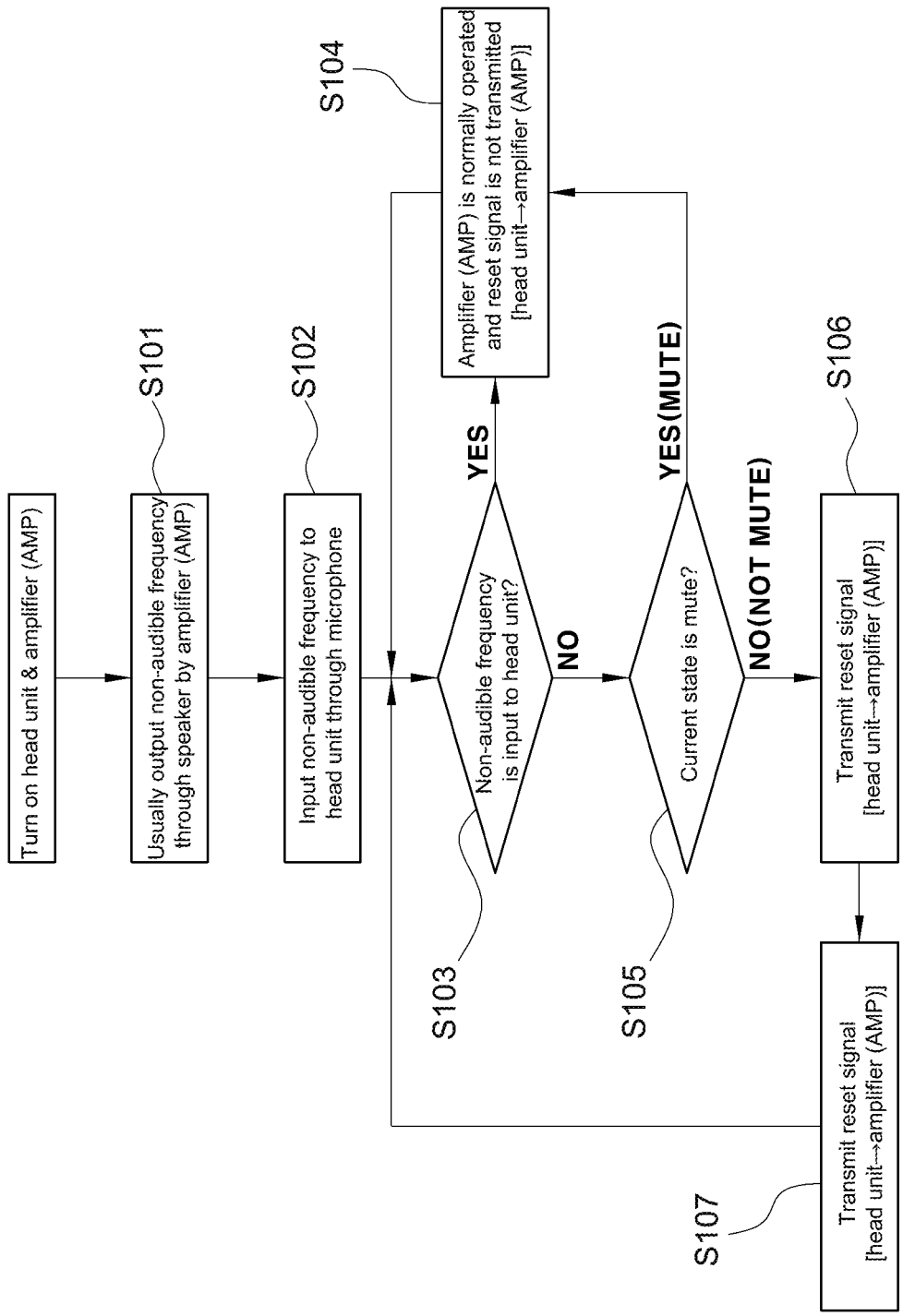
FIG. 2 is an exemplary flowchart illustrating a method of resetting an amplifier of an AVN system for a vehicle according to an exemplary embodiment of the present invention.

As shown in FIG. 2, the present invention is focused on the automatic reset of the amplifier when the amplifier is in an abnormal state (e.g., amplifier failure due to conflict between several logics) by determining whether the amplifier is operating normally (e.g., without failure). Accordingly, a non-audible frequency may be used as a signal for determining whether the amplifier is operating normally.

A non-audible frequency output unit 12, which may be separately provided for outputting the non-audible frequency through a speaker 20 into the interior of a vehicle, may be installed on the amplifier 10. Since the non-audible frequency output unit 12 may be configured to output the non-audible frequency into the interior of a vehicle when the amplifier 10 is powered on, the non-audible frequency may be sensed through a microphone 30 mounted within the vehicle. For reference, the audible frequency may be in the range of about 20 Hz to 20 kHz and the non-audible frequency may be beyond the range of about 20 Hz to 20 kHz.

The microphone 30 may be configured to sense the non-audible frequency output through the speaker 20 from the non-audible frequency output unit 12 and transmit the sensing signal to the reset controller 40. The reset controller 40 may be configured to receive the sensed signal and determine whether to reset the amplifier 10. The reset controller 40, which may be a controller configured to reset the amplifier 10, may be employed as a head unit mounted on the AVN system of a vehicle.

Moreover, the reset controller 40 may include a signal regarding whether to mute sound, and may be configured to provide the signal to a sound mute unit 14 of the amplifier 10. For example, when a user pushes a mute button, the sound mute unit 14 of the amplifier 10 may be configured to execute a mute function preventing sound from being output through the speaker. Thus, when the reset controller 40 does not receive the signal having the non-audible frequency from the microphone and simultaneously, receives a signal informing that the sound mute unit 14 is not in a mute state, the reset controller 40 may be configured to determine that the amplifier is in an abnormal state (e.g., failure state), and thus may be configured to automatically reset the amplifier 10.

Furthermore, the method of resetting an amplifier of an AVN system for a vehicle according to the present invention will be described in more detail with reference to FIGS. 1 and 2. First, in step S101, the non-audible frequency may be output through the speaker 20 from the non-audible frequency output unit 12 of the amplifier 10. In step S102, the non-audible frequency output into the interior of the vehicle may be sensed by the microphone 30 and transmitted to the reset controller 40 which may be a head unit.

The reset controller 40 may be configured to determine whether the signal having the non-audible frequency is received in step S103, and when the signal having the non-audible frequency is not received, the reset controller 40 may be configured to determine that the amplifier 10 is operating normally (e.g., not perform the resetting of the amplifier 10). That is, when the signal having the non-audible frequency is received, the non-audible frequency is output from the non-audible frequency output unit 12 of the amplifier 10, and thus, the reset controller 40 may be configured to determiner that the amplifier 10 is operating normally.

In step S105, the reset controller 40 may be configured to determine whether the mute function of the amplifier 10 is engaged and may be configured to receive the signal having the non-audible frequency to determine whether to reset the amplifier 10. Thus, in step S106, after the reset controller 40 has determined whether the amplifier 10 is in the mute state, the reset controller 40 may be configured to transmit a reset control signal to the amplifier 10 when the signal having the non-audible frequency is not received and simultaneously, the amplifier 10 is not in the mute state.

In other words, when the reset controller 40 does not receive the signal of the non-audible frequency, the non-audible frequency is not output from the non-audible frequency output unit 12, and thus the reset controller 40 may be configured to determine that the amplifier 10 is in an abnormal state and may be configured to execute the reset control. Thus, in step S107, the amplifier 10 may be reset based on the reset control signal transmitted from the reset controller 40.

Meanwhile, even while the mute function of the sound mute unit 14 of the amplifier 10 is engaged, the reset controller 40 may be configured to not perform the control of resetting the amplifier in step S104. Since the non-audible frequency may not be generated from the non-audible frequency output unit 12 of the amplifier 10 while the mute function of the sound mute unit 14 is engaged, the reset controller 40 may be configured to not reset the amplifier 10 even while the mute function is engaged.

Therefore, in response to determining that the signal having the non-audible frequency output from the non-audible frequency output unit is not input to the reset controller and the amplifier is not currently in the mute state, the amplifier may be automatically reset.

The invention has been described in detail with reference to exemplary embodiments thereof. However, it will be appreciated by those skilled in the art that changes may be made in these embodiments without departing from the principles and spirit of the invention, the scope of which is defined in the accompanying claims and their equivalents.

What is claimed is:

1. A system for resetting an amplifier of an audio video navigation (AVN) system for a vehicle, comprising:
   a microphone configured to sense whether a non-audible frequency generated by a non-audible frequency output unit which is beyond the range of about 20 Hz to 20 kHz is output from a speaker through an amplifier; and
   a reset controller configured to receive a signal from the microphone and determine whether to reset the amplifier, and the reset controller is configured to determine a mute sound state,
   wherein the reset controller is configured to reset the amplifier in response to receiving no output signal having the non-audible frequency from the microphone and in response to determining a non-mute state.

2. A method of resetting an amplifier of an audio video navigation (AVN) system for a vehicle, comprising:
   sensing, by a microphone, a signal having a non-audible frequency generated by a non-audible frequency output unit from a speaker driven by the amplifier;
   determining, by a controller, whether to reset the amplifier based on whether the output signal is received and whether sound from the amplifier is muted; and
   operating, by the controller, the amplifier without an automatic reset in response to receiving the output signal having the non-audible frequency to determine that the amplifier is operating normally.

3. The method of claim 2, further comprising:
   in response to receiving no output signal having the non-audible frequency from the microphone and determining a non-mute state of the amplifier, resetting, by the controller, the amplifier.

4. The method of claim 2, further comprising:
   operating, by the controller, the amplifier without an automatic reset in response to determining the sound from the amplifier is muted.

5. The method of claim 4, further comprising:
   preventing, by the controller, the output of the non-audible frequency is response to determining the sound from the amplifier is muted.

6. A non-transitory computer readable medium containing program instructions executed by a controller, the computer readable medium comprising:
   program instructions that control a microphone for sensing a signal having a non-audible frequency generated by a non-audible frequency output unit from a speaker driven by an amplifier;
   program instructions that determine whether to reset the amplifier based on whether the output signal is received and whether sound from the amplifier is muted; and
   program instructions that operate the amplifier without an automatic reset in response to receiving the output signal having the non-audible frequency to determine that the amplifier is operating normally.

7. The non-transitory computer readable medium of claim 6, further comprising:
   program instructions that reset the amplifier in response to receiving no output signal having the non-audible frequency from the microphone and determining a non-mute state of the amplifier.

8. The non-transitory computer readable medium of claim 6, further comprising:
   program instructions that operate the amplifier without an automatic reset in response to determining the sound from the amplifier is muted.

9. The non-transitory computer readable medium of claim 8, further comprising:
   program instructions that prevent the output of the non-audible frequency is response to determining the sound from the amplifier is muted.

* * * * *